United States Patent
Gratz et al.

(10) Patent No.: US 8,970,008 B2
(45) Date of Patent: Mar. 3, 2015

(54) WAFER AND INTEGRATED CIRCUIT CHIP HAVING A CRACK STOP STRUCTURE

(71) Applicant: Infineon Technologies AG, Neubiberg (DE)

(72) Inventors: Achim Gratz, Dresden (DE); Thimo Schindelar, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/829,582

(22) Filed: Mar. 14, 2013

(65) Prior Publication Data

US 2014/0264767 A1 Sep. 18, 2014

(51) Int. Cl.
*H01L 23/544* (2006.01)
*H01L 21/78* (2006.01)

(52) U.S. Cl.
CPC .............. *H01L 23/544* (2013.01); *H01L 21/78* (2013.01)
USPC .......................................................... 257/620

(58) Field of Classification Search
CPC ............................. H01L 21/682; H01L 23/544
USPC .......................................................... 257/620
See application file for complete search history.

(56) References Cited

U.S. PATENT DOCUMENTS

| | | | |
|---|---|---|---|
| 5,789,302 A | 8/1998 | Mitwalsky et al. | |
| 7,898,056 B1 | 3/2011 | Keramat et al. | |
| 2005/0145993 A1* | 7/2005 | Sasaki et al. | 257/620 |
| 2006/0012012 A1* | 1/2006 | Wang et al. | 257/620 |
| 2007/0257371 A1* | 11/2007 | Wakayama et al. | 257/758 |
| 2009/0203192 A1 | 8/2009 | Kaltalioglu et al. | |
| 2009/0267193 A1* | 10/2009 | Hayasaki | 257/620 |
| 2009/0289325 A1* | 11/2009 | Wang et al. | 257/510 |
| 2009/0294912 A1* | 12/2009 | Chibahara et al. | 257/620 |
| 2009/0321890 A1* | 12/2009 | Jeng et al. | 257/620 |
| 2011/0024882 A1* | 2/2011 | Takemura et al. | 257/620 |
| 2011/0127631 A1* | 6/2011 | Kawashima | 257/466 |
| 2012/0286397 A1* | 11/2012 | Kuechenmeister et al. | 257/620 |
| 2013/0075869 A1* | 3/2013 | Mackh et al. | 257/620 |
| 2013/0299948 A1* | 11/2013 | Tsutsue et al. | 257/620 |

OTHER PUBLICATIONS

Agwai, Abigail, et al., "Peridynamic Theory for Failure Prediction in Multilayer Thin-Film Structures of Electronic Packages," Electronic Components and Technology Conference, May 27-30, 2008, pp. 1614-1619.

Buehler, M., et al., "Multi-Paradigm Modeling of Dynamical Crack Propagation in Silicon Using the ReaxFF Reactive Force Field," Materials and Process Simulation Center (MSC), Division of Chemistry, California Institute of Technology, Jan. 13, 2006, 6 pgs.

"Fracture," from Wikipedia, the free encyclopedia (https://en.wikipedia.org/wiki/Fracture), last updated version May 12, 2013, 5 pgs.

(Continued)

*Primary Examiner* — Nathan Ha
(74) *Attorney, Agent, or Firm* — Slater & Matsil, L.L.P.

(57) ABSTRACT

A wafer has a number of IC areas and a kerf area arranged between the IC areas. The kerf area has a dicing area, a crack stop structure arranged between an IC area and a dicing area, and a trench arranged between the crack stop structure and the dicing area. The crack stop structure includes an extended layer extending beyond the crack stop structure towards the dicing area.

22 Claims, 14 Drawing Sheets

(56) References Cited

OTHER PUBLICATIONS

Hess, P., et al., "Interface and Bulk Fracture Modes and Strengths Determined by Laser-Induced Stress Pulses," Institute of Physical Chemistry, University of Heidelberg, 2010, 8 pgs.

Hess, P., "Laser Based Determination of Decohesion and Fracture Strength of Interfaces and Solids by Nonlinear Stress Pulses," University of Heidelberg, Acoustic Waves, Sep. 2010, 20 pgs.

Kahn, H., et al., "Dynamic Fatigue of Silicon," Current Opinion in Solid State and Materials Science, vol. 8, Issue 1, Jan. 2004, pp. 71-76.

Kim, D., et al., "Microscale Oscillating Crack Propagation in Silicon Nitride Thin Films," Applied Physics Letters 97.071902, published online Aug. 16, 2010, 2 pgs.

Kim, Taek-Soo, et al., "Integration Challenges of Nanoporous Low Dielectric Constant Materials," Device and Materials Reliability, IEEE Transactions, vol. 9, Issue 4, Dec. 2009, pp. 509-515.

Kozhushko, V., et al., "Comparison of Mode-Resolved Fracture Strength of Silicon with Mixed-Mode Failure of Diamond Crystals," Institute of Physical Chemistry, University of Heidelberg, Engineering Fracture Mechanics, vol. 77, Issue 10, Jan. 2010, pp. 193-200.

Liu, Xiao, et al., Mechanical Reliability Outlook of Ultra Low-k Dielectrics, IBM Corporation, IBM TJ Watson Research Center, Advanced Metallization Conference, Albany, New York, Oct. 5-7, 2010, 34 pgs.

Nam, K., et al., "Patterning by Controlled Cracking," DOI:10.1038/Nature11002, vol. 485, May 10, 2012, pp. 221-224.

Perez, R., et al., "An AB Initio Study of the Cleavage Anisotropy in Silicon," Acta Materialia, vol. 48, Dec. 2000, pp. 4517-4530.

Ravindra, Deepak, et al., "Chaper 23 Ductile Mode Micro Laser Assisted Machining of Silicon Carbide (SiC)," Properties and Applications of Silicon Carbide, Apr. 4, 2011, pp. 505-537.

Ritchie, R., "Failure of Silicon: Crack Formation and Propagation," 13th Workshop on Crystalline Solar Cell Materials and Processes, Aug. 2003, 42 pgs.

Roesch, F., et al., "Crack Front Propagation by Kink Formation," Stuttgart Research Centre for Simulation Technology (SRC SimTech), Issue No. 2009-55, Oct. 12, 2009, 5 pgs.

"Laser-Based Diagnostics of Materials with Linear and Nonlinear Surface Acoustic Waves (SAWs)," University of Heidelberg, May 5, 2013, 7 pgs.

Tambat, A., et al., "Simulations of Damage, Crack Initiation, and Propagation in Interlayer Dielectric Structures: Understanding Assembly-Induced Fracture in Dies," Device and Materials Reliability, IEEE Transactions, Jun. 1, 2012, pp. 241-254.

Vagues, M., "Analysing Backside Chipping Issues of the Die at Wafer Saw," In Partial Fulfillment of MatE 234, May 10, 2003, 23 pgs.

Vanstreels, K., et al., "Intrinsic Effect of Porosity on Mechanical and Fracture Properties of Nanoporous Ultralow-k Dielectrics," Appl. Phys. Letters, 101, Sep. 19, 2012, 2 pgs.

Wang, Guotao, et al., "Packaging Effects on Reliability of Cu/low-k Interconnects," Device and Materials Reliability, IEEE Transactions, vol. 3, Issue 4, Dec. 2003, pp. 119-128.

Wu, P.-H., et al., "Mechanical Property Characterization of Sputtered and Plasma Enhanced Chemical Deposition (PECVD) Silicon Nitride Films After Rapid Thermal Annealing," Sensors and Actuators A: Physical, vol. 168, Issue 1, Jul. 2011, pp. 117-126.

\* cited by examiner

FIG 5
(a)
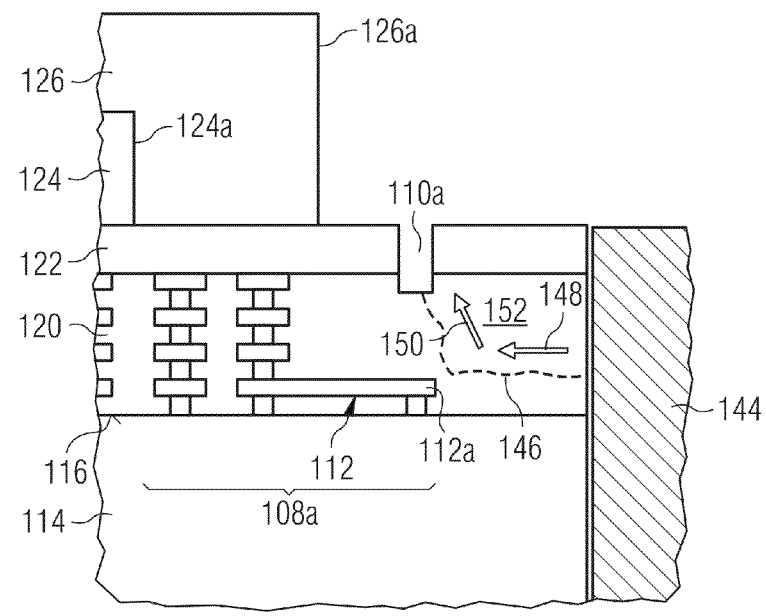
(b)
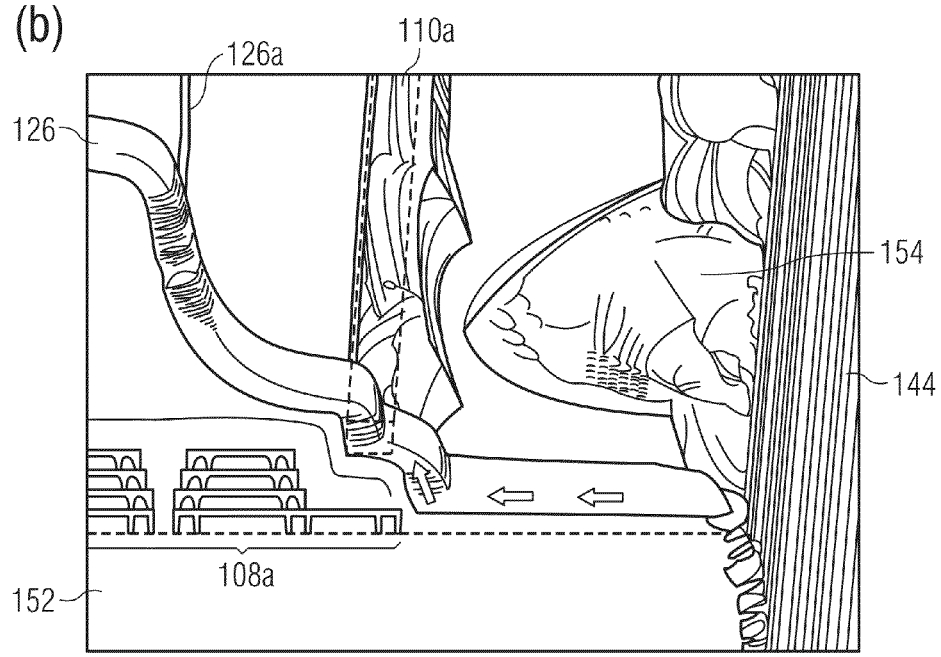

(c)

WAFER AND INTEGRATED CIRCUIT CHIP HAVING A CRACK STOP STRUCTURE

TECHNICAL FIELD

Embodiments of the invention relate to wafers, integrated circuit chips and methods for manufacturing same, especially to the field of mechanical dicing processes for dicing wafers to form integrated circuit chips.

BACKGROUND

Integrated circuit chips may be manufactured on the basis of wafers which are processed to manufacture, at the same time, a plurality of integrated circuits. The wafer needs to be separated or diced for obtaining the individual integrated circuit chips which may be subjected to further processing steps, e.g., packaging. Separating the wafer into integrated circuit chips may be done by mechanical dicing processes, for example, by sawing the wafer along predefined sawing paths. This may include either completely sawing through the wafer or sawing a trench into a surface of the wafer and breaking the wafer.

SUMMARY OF THE INVENTION

A wafer includes a plurality of integrated circuit (IC) areas and a kerf area arranged between the plurality of IC areas. The kerf comprises a dicing area, a crack stop structure arranged between an IC area and the dicing area, and a trench arranged between the crack stop structure and the dicing area, wherein the crack stop structure includes an extended metal layer extending beyond the crack stop structure towards the dicing area.

Figure 3:
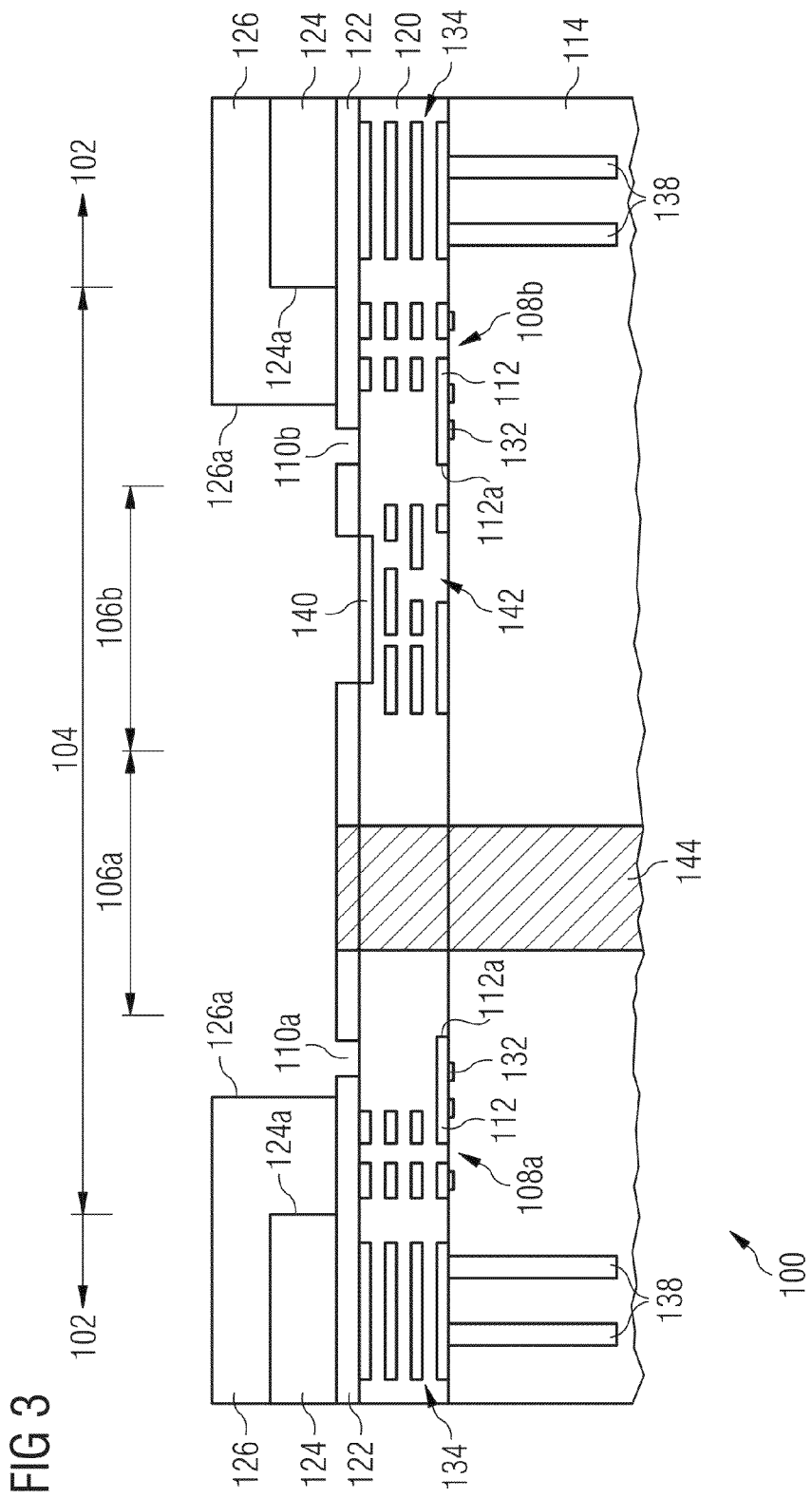
FIG. 3 shows another embodiment of a wafer in accordance with embodiments of the invention.
Figure 4:
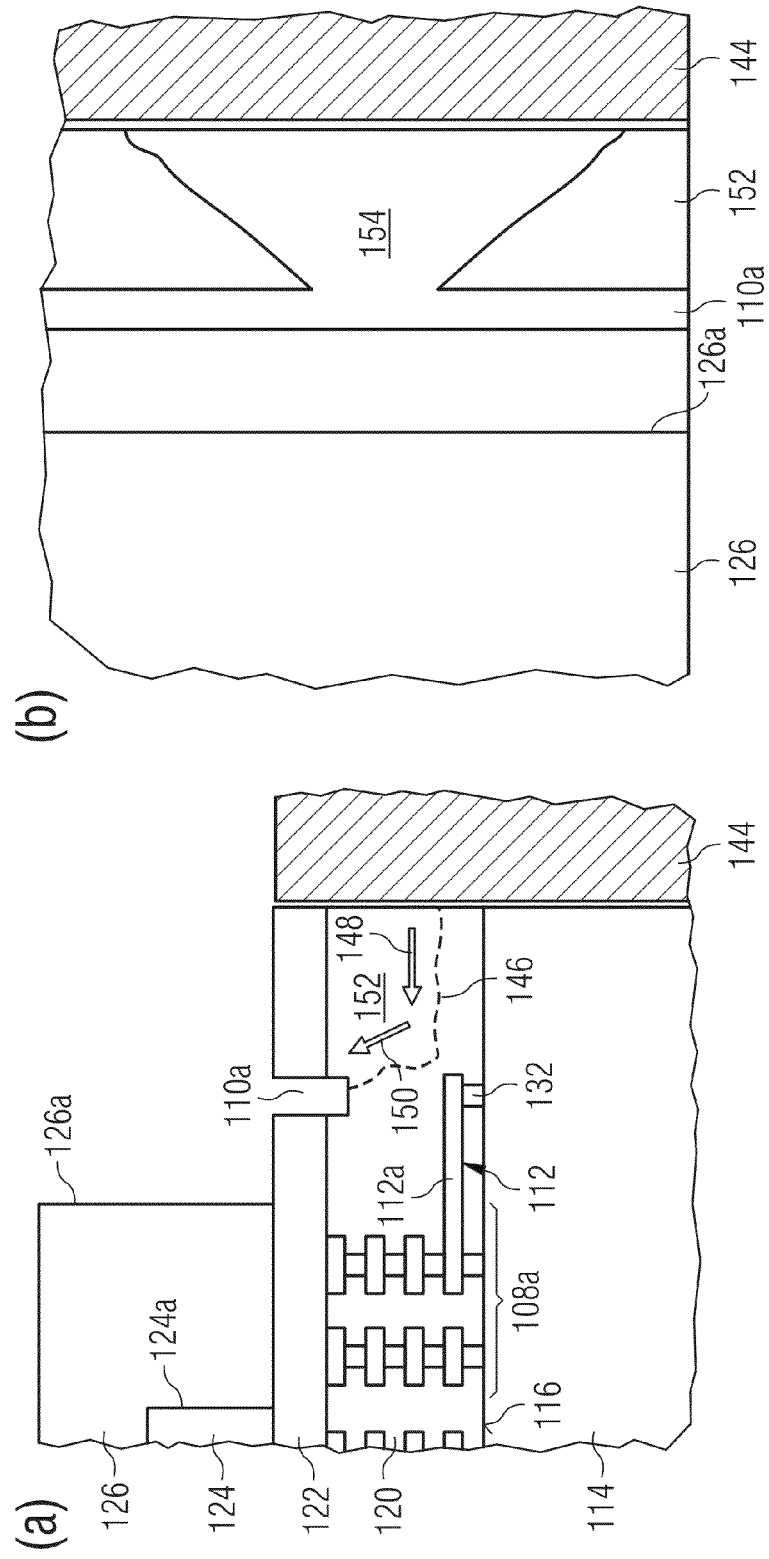
FIG. 4(a) shows a left hand portion of the wafer of FIG. 3.
Figure 5:
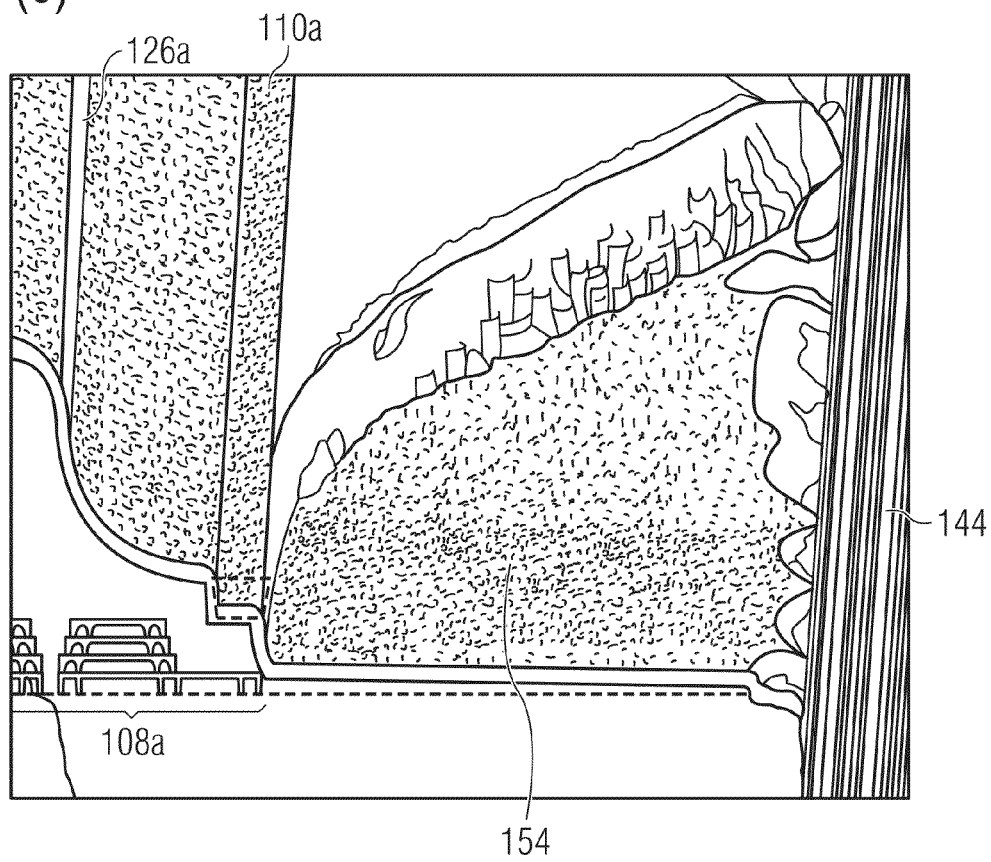
Figure 6:
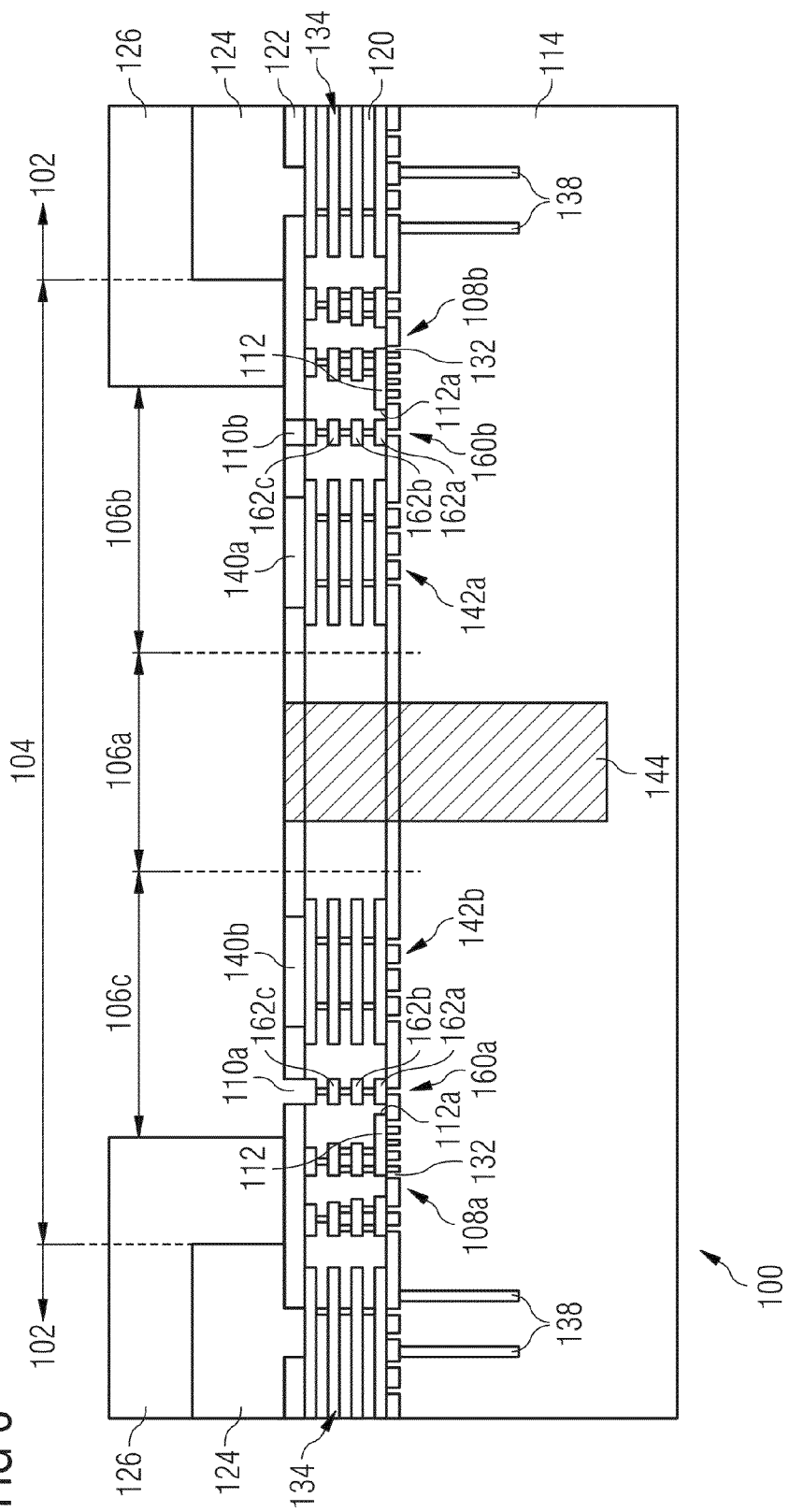
Figure 7:
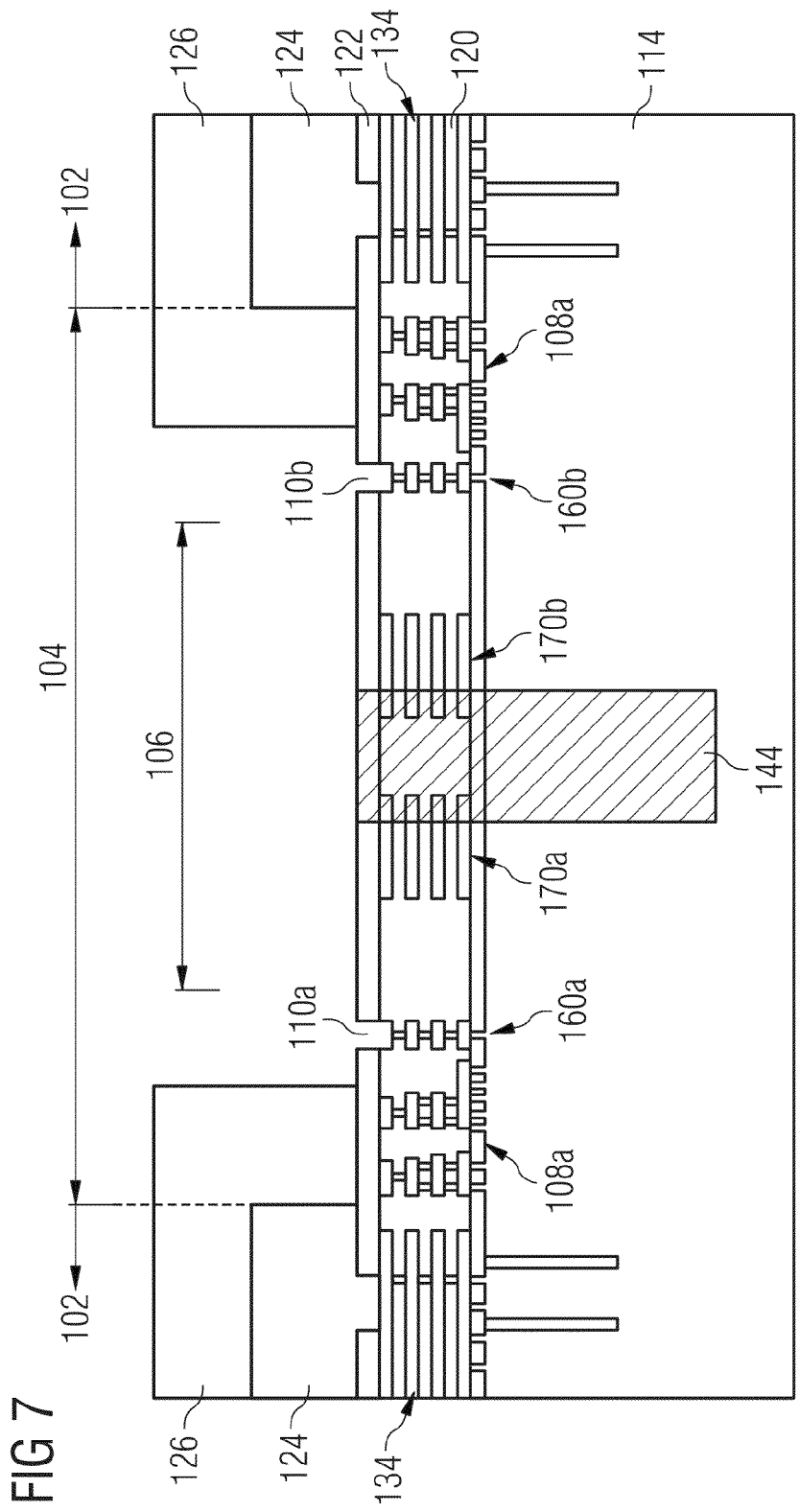
Figure 8:
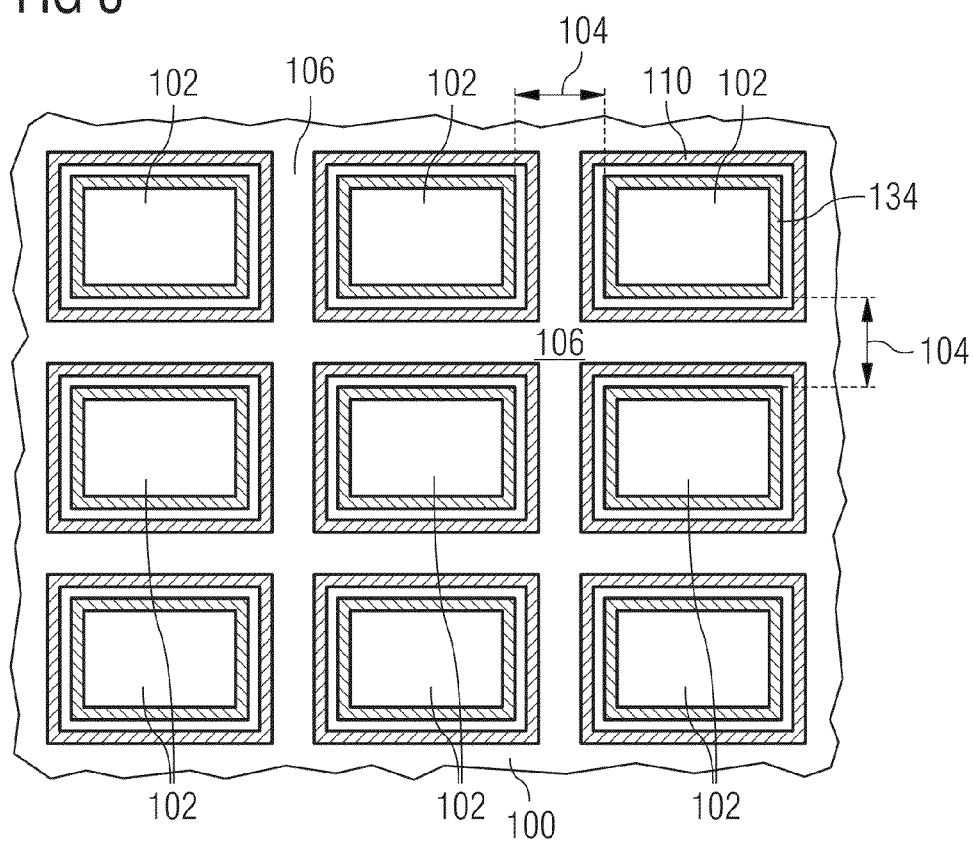
Figure 9:
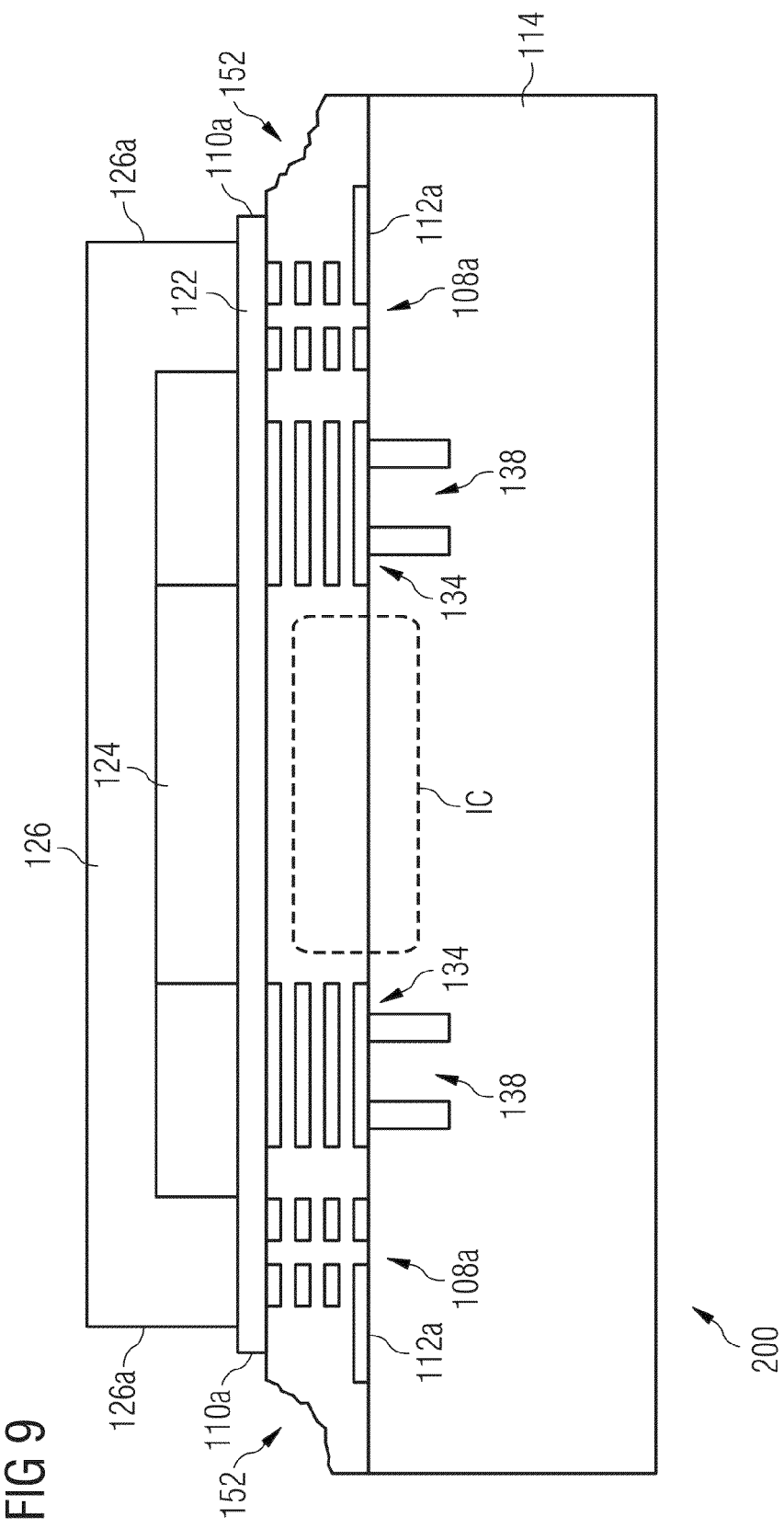
Figure 10:
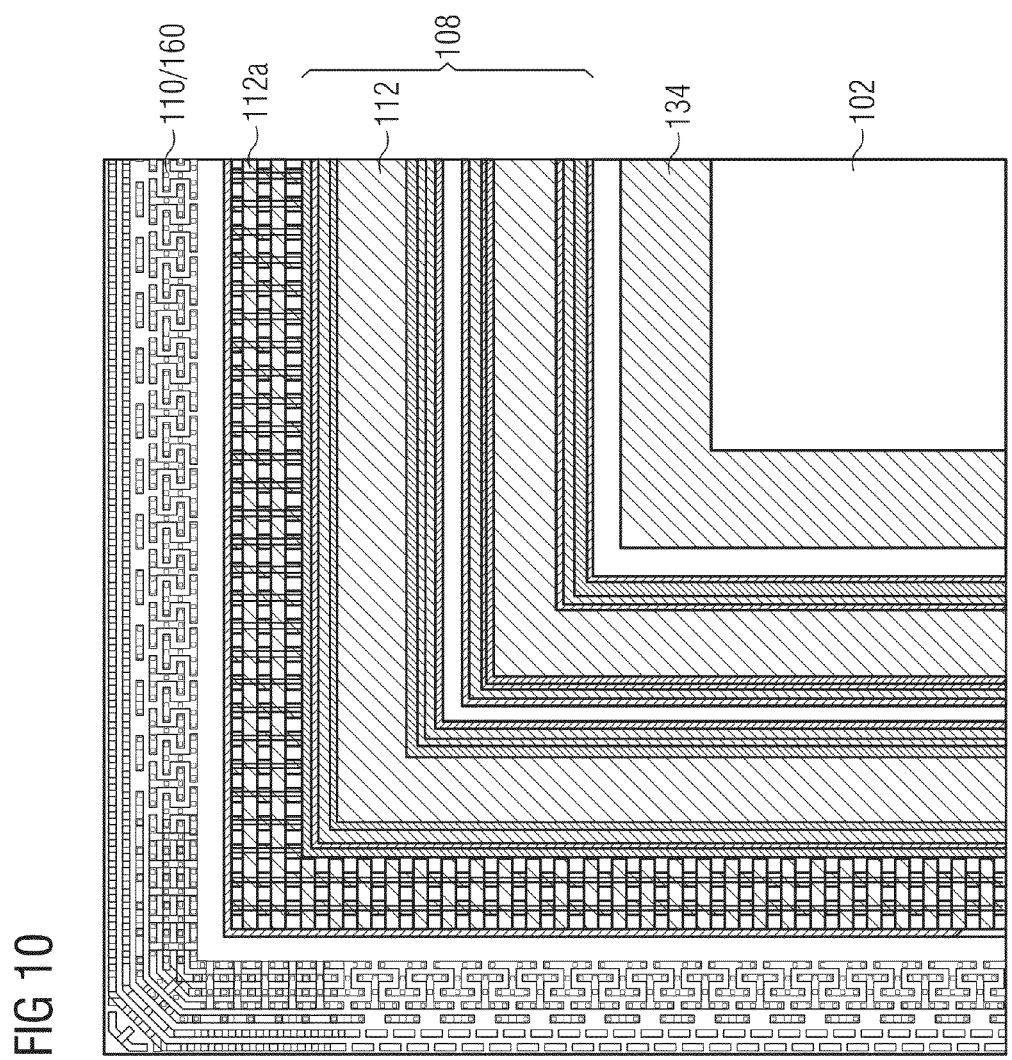
Figure 11:
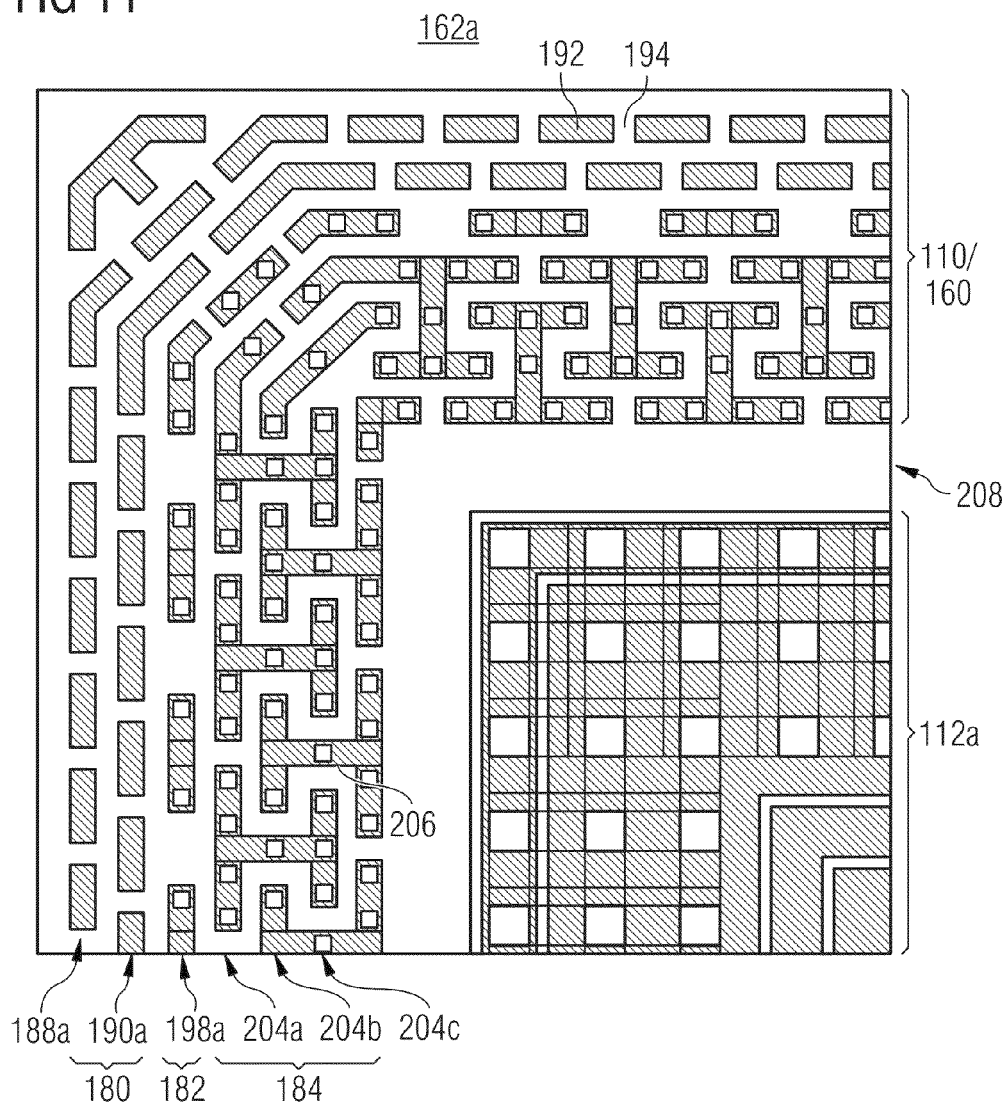
Figure 12:
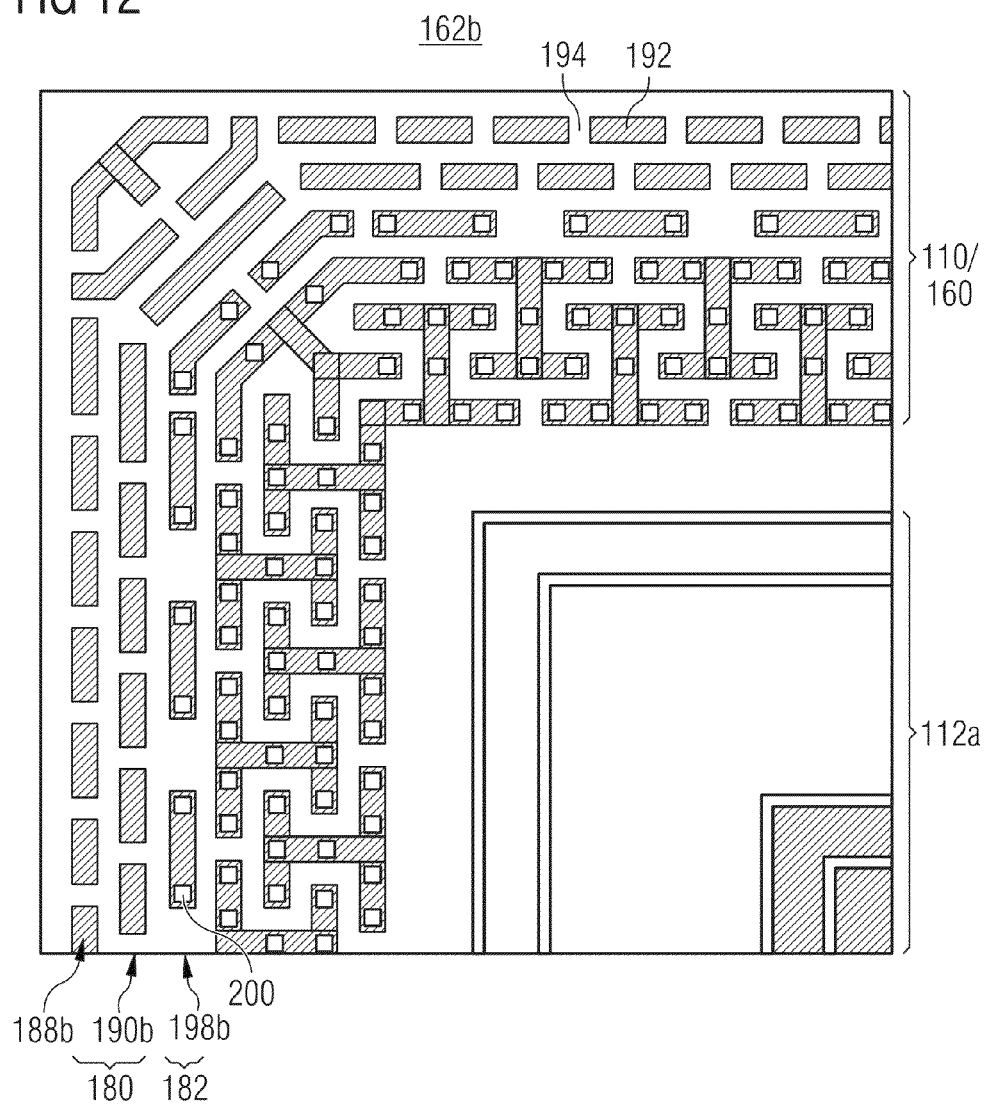
Figure 13:
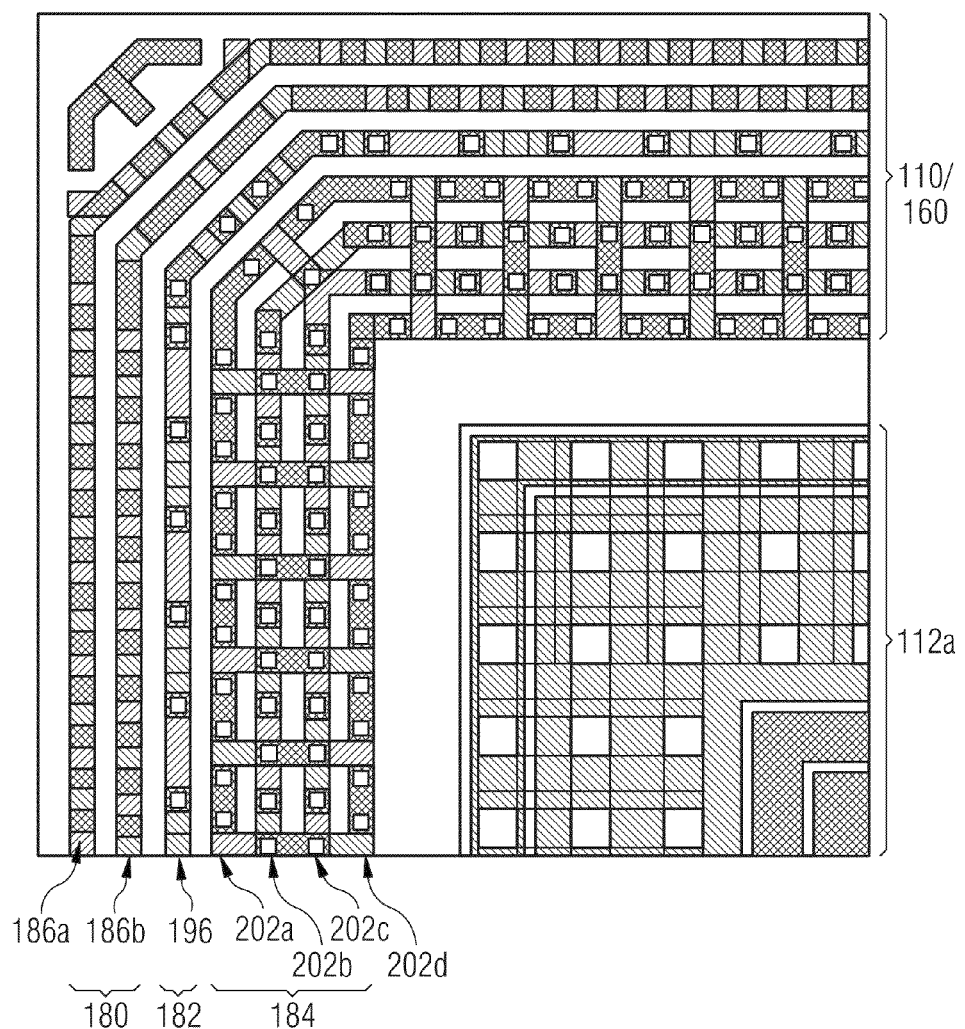

FIG. (4b) shows a top view of the structure shown in FIG. 4(a);

FIG. 5(a) shows the same portion of the wafer of FIG. 3 as in FIG. 4(a);

FIG. 5(b) is a photographic representation of the actual structure of a wafer incorporating the inventive chipping stop structure;

FIG. 5(c) shows a further photographic representation of the structure of FIG. 5(a) taken along a line of FIG. 5(b) which is basically in the center of the chipping area;

FIG. 6 shows yet another embodiment of the invention including an additional crack stop structure;

FIG. 7 shows another embodiment of a wafer including the inventive structure for stopping cracks and avoiding chipping;

FIG. 8 is a top view of a wafer having the inventive structure;

FIG. 9 shows an integrated circuit chip that is obtained by separating a wafer as it is depicted in FIG. 8;

FIG. 10 shows an enlarged view of a corner portion of the wafer shown in FIG. 8;

FIG. 11 shows an even more enlarged view of the corner portion of FIG. 10, with concentrating, however, on lowermost metal layer;

FIG. 12 shows an even more enlarged view of the corner portion of FIG. 10, with concentrating, however, on the next higher metal layer; and FIG. 13 shows an even more enlarged view of the corner portion of FIG. 10, with commonly showing, in an overlay, the lowermost and next higher metal layer.

DETAILED DESCRIPTION OF ILLUSTRATIVE EMBODIMENTS

In the following embodiments of the invention will be described with regard to the accompanying drawings. Prior to describing embodiments in further detail a description on cracks and crack propagation in bulk silicon and BEOL stacks (BEOL=Back End of Line) will be given.

CMOS Technologies have traditionally employed a sealring structure consisting of two concentric sealrings with identical structure. The inner sealring serves primarily as ion and moisture barrier, while the outer sealring functions as a crack stop. Consequently it used to be in order when the other sealring became damaged during dicing or packaging as long as the inner sealring stayed intact.

The push for "zero defect" quality however has produced the requirement to ascertain that no cracks should propagate through the outer sealring during the lifetime of the product. This, in turn, has been interpreted as a requirement for "crack-free" dicing, which conflicts with other requirements for throughput and dicing cost. Since it is physically impossible to have a truly crack-free process with mechanical dicing, the next line of defense has been to mandate inspection and require that the outer perimeter of the crackstop be completely crack-free. This of course negates the very purpose of having a crackstop in the first place and has not met with much success so far. More importantly, optical inspection has not been verified to actually detect all defects that may propagate to the inner sealring or the active chip area and is therefore not effective except for catastrophic dicing results.

This situation has led to many misguided attempts to optimize KERF structures over the last few years, with little to no measurable improvement in actual dicing quality, but at very substantial cost in lost productivity and potential yield.

Mechanical dicing is always producing cracks, since that is the principal mechanism that initiates the removal of material. The basic question therefore is not how to prevent cracks, but how to stop them from propagating past certain boundaries by controlling the crack length distribution or the crack propagation direction. It is also important to discern between different mechanisms of cracking since each mechanism features distinct crack induction and propagation properties.

Crack induction is associated with microvoids, which accumulate until a crack tip and ultimately a microcrack is formed. Pre-existing defects and inhomgeneities in the material often act as nucleation centers for such microvoids and hence become a source of microcracks.

The development from microcracks into macroscopic cracks is facilitated by crack propagation. Cracks propagate in the normal plane with respect to the applied stress vector. Since during propagation the crack energy is successively released and the material weakened, the stress vector generally changes direction as well.

Cracks induced and propagated by external loads can, in principle, become infinitely large unless their energy can be limited.

Cracks in bulk silicon are the most dangerous, since propagation will happen along cleavage planes (<111> being the predominant direction in the absence of dislocations and stress gradients) with very low energy and can therefore reach active structures in the chip in extreme cases. A bulk silicon crack (a two-dimensional crystal defect) is initially electrically inactive until either a macroscopic separation of the crack surface happens or the crack gets decorated with electrical charges or dopants.

Microcrack propagation kinetics in crystalline silicon is a well-studied topic, yet still under active research. Severity of this propagation phenomenon increases with defect density and pre-existing crack size, but not environmental conditions such as moisture (in marked difference to glass, for instance). There is no fatigue in bulk silicon (dynamic fatigue in both single crystal and polycrystal silicon has recently been reported, but seems to be related to pre-existing defects), although fatigue-like effects can be introduced by interfacial layers in thin-film structures. The propagation of silicon cracks is complicated by the fact that instabilities depending on crack propagation velocity exist that can lead to a change of cleavage plane or propagation direction, respectively.

It is therefore important to reduce both the density and size of microcracks in order to reduce the potential for crack propagation into electrically active structures. This implies that both the backside of the chip as well as the sidewalls should be as smooth as possible and chipping free.

Cracks in BEOL (BEOL=Back End Of Line) can happen in several fundamentally different ways. The intermetal dielectric and liner materials are susceptible to both bulk and thin-film cracking mechanisms. Furthermore, the wiring metal can both crack and plastically deform under applied stress. Finally, all interfaces between different materials can delaminate. The occurrence of different materials also provides a rich source of corrosion induced cracking phenomena. All these mechanisms can exhibit fatigue failures (induced by non-constant load, most often due to thermo-mechanical cycling).

Each combination of layout, frontend and backend processes exhibits a different mixture of cracking and delamination processes that need to be safeguarded against in some way. In general, implementing countermeasures against crack propagation implies an incremental cost-adder to the chip. It is hence mandatory to determine the dominant mechanisms of the concrete technology or even product to ensure that any mitigation measures target a relevant crack mechanism with the right amount of margin against layout or process variability.

Crack mitigation strategies can be roughly categorized as follows:
Crack Avoidance determines the maximum crack length and keeps all sensitive structures further than that length (plus some margin) away from any crack source.
Crack Deflection changes the preferred propagation direction of cracks to avoid sensitive structures.
Crack Termination provides structures that release enough crack energy to stop further propagation.

This generally implies discontinuities (additional structures) in the direction of crack propagation.

If very low failure rates are targeted, crack avoidance becomes very costly due to the fact that crack length distributions are typically multi-modal and heavy-tailed. Crack deflection is often constrained by function parameters that cannot be changed. Successful crack mitigation measures are a combination of these three strategies. For instance, both crack deflection and termination will also minimize crack length or reduce the tail of the crack length distribution.

Due to the multi-layer and multi-material nature of the BEOL there is a rich source of interfaces and internal surfaces that can release the energy of a crack and hence stop its further propagation. The most effective structures are pocket-like arrangements of at least three different layers or materials. This is most effective in combination with layout structures that also deflect cracks away from the chip by having a preferred direction along the sawing street.

Due to the typical crack length distribution (related to crack energy), it is useful to provide small, non-interconnected sacrificial structures nearest to a crack source to release most (typical) cracks. The remaining cracks with higher energy should then (after having already released some energy) successively find structures of increasing strength (for instance interconnected and intertwined metal shapes) to progressively shed more energy or deflect them along the sawing street or towards the surface. The last line of defense should terminate any remaining cracks so that a propagation during or after packaging can be ruled out. To that end, these structures must be sufficiently intertwined and interconnected, so that any propagating crack would have to change direction at least twice to reach past the crackstop.

Thus, mechanical dicing processes as they are known may cause a significant chipping in the kerf areas where, for example, electrical test modules may be placed. For example, a structure may include a polyimide layer and a crack stop structure arranged below the polyimide layer that works as a peeling stopper. However, this structure may be disadvantageous in that it is not possible to assess the effectiveness of the structure against chipping. Thus, problems regarding a decrease in quality after pre-assembly of integrated circuit boards still exist.

Therefore, there is a need to provide an approach which allows increasing the quality of integrated circuit devices after completing pre-assembly thereof. Further, a need exists to further optimize the kerf construction and/or the chip sealring construction with regard to the above mentioned chipping problem.

In accordance with embodiments, the present invention provides an approach improving the resistance to chipping and thereby improving the quality of the devices after separating them into integrated circuit chips by providing in addition to the crack stop structure a trench, for example, a passivation trench, that is arranged between the crack stop structure and the dicing area of the wafer. In addition, a metal layer of the crack stop structure is formed so as to extend beyond the crack stop structure towards the trench. In accordance with embodiments the metal layer may extend such a that its extended edge vertically coincides with the trench. In accordance with embodiments, the metal layer is nailed by contacts to the underlying structure, for example, to the underlying substrate, to prevent lifting of the metal layer from the substrate during a dicing process.

A wafer being provided with the extended metal layer and the additional trench provides for a structure that weakens the structural integrity at the respective portion so that laterally propagating cracks will be deflected essentially perpendicular to the surface of the substrate so that the chipping will stop before the polyimide area or the polyimide edge is reached. Thus, electrical integrated circuits that may be arranged under the polyimide layer are protected from defects due to chipping in the kerf area. Further, the area between the edge of the polyimide layer and the trench can be used as an inspection/rejection area, and on the basis of an inspection of this area it can be determined as to whether the separated chip has been subjected to damages extending beyond the crack stop structure and the sealring structure towards the inside of the chip structure.

In accordance with further embodiments, a further crack stop pattern or crack stop structure may be provided under the trench. This allows to even more reliably stop cracks with high energy without consuming more area, since the width of the crack stop structure is designed to be substantially the same as the width of the trench.

Figure 1:
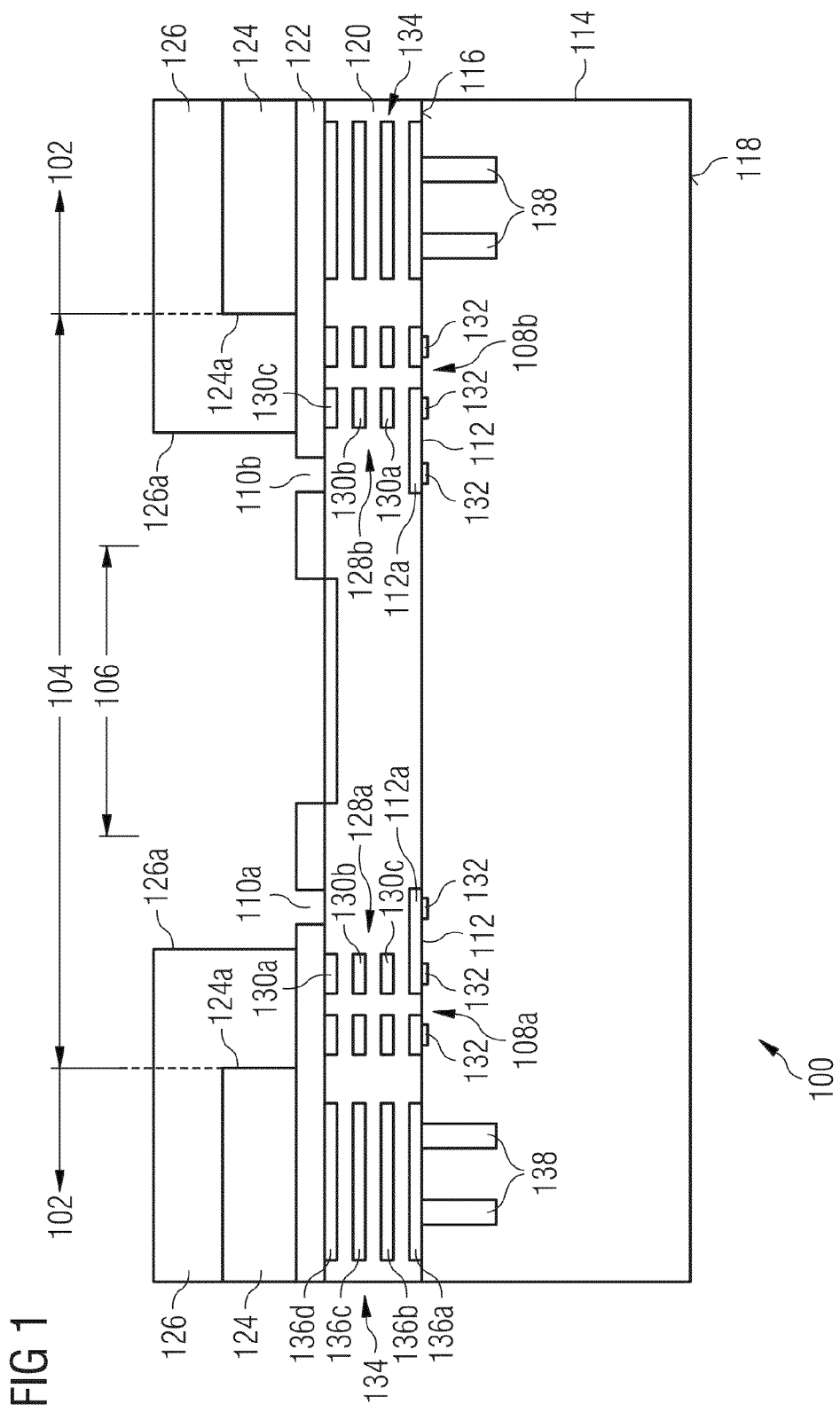
FIG. 1 shows a first embodiment of a wafer including the improved crack stop structure.

FIG. 1 shows a first embodiment of a wafer including the improved crack stop structure described above. A portion of a wafer 100 is depicted, more specifically a cross-sectional view through the wafer 100 at a position between two adjacent integrated circuit (IC) areas 102. Between the integrated circuit areas 102 a kerf area 104 is arranged. The kerf area 104 comprises a dicing area 106 which is the area in which a separating tool, for example, a dicing blade or a laser beam, is directed to the wafer 100 for separating the wafer 100, thereby generating the IC chips including the respective IC areas 102. The kerf area further comprises crack stop structures 108a, 108b arranged between the IC areas 102 and the dicing area 106. Further, the kerf area 104 comprises a trench 110a, 110b arranged between the dicing area 106 and the crack stop structure 108a, 108b. The crack stop structure 108a, 108b comprises a metal layer 112 extending beyond the crack stop structure 108a, 108b towards the dicing area 106. The metal layer 112 comprises an extension 112a that extends beyond the structure 108a, 108b towards the dicing area 106.

The trench 110a, 110b is formed in the passivation layer 122 and may also be referred to as "passivation trench." The trenches 110a, 100b may be formed by etching a groove using known lithographic processes, or by other known processes. The trench 110a, 110b extends through the entire thickness of the passivation layer 122, thereby exposing an upper surface of the interconnect layer 120. The extended portion 112a of the metal layer 112 extends under the trench 110a, 110b. It may extend such that an edge of the extension 112a of the metal layer 112 facing the dicing area 106 vertically coincides with an inner trench wall of the trench 110a, 110b that also faces the dicing area.

The wafer comprises a semiconductor substrate 114, for example, a silicon substrate, having a first or front surface 116 and a second or back surface 118 that is opposite to the front surface 116. The wafer 100 further comprises an interconnect layer 120. In the IC areas 102 elements of integrated circuits are formed. For example, in the substrate 114 diffusion areas or the like for defining integrated circuit elements or part thereof may be formed, whereas further elements, like metallization structures and the like, may be formed in the interconnect layer.

On a surface of the device layer 102 facing away from the substrate 114 a passivation layer 122 is formed. A metal layer 124 is arranged on top of the passivation layer. Although shown as being continuously formed across the IC area, metal layer may be discontinuously formed within the IC area. The metal layer 124 is covered by a polyimide layer 126. The passivation layer 126 is provided on the wafer 100 in the IC areas 102 and also in the kerf area 104. The metal layer 124 is only provided in the IC areas 102. The polyimide layer 126 extends from the IC areas 102 into the kerf area 106. The polyimide layer 126 may terminate at a distance from the trenches 110a, 110b such that the distance between the polyimide layer edge 126a and the trench 110a, 110b is smaller than the distance between the polyimide layer edge 126a and the beginning of the IC area 102 or the metal layer edge 124a. In the area between the metal layer 124 and the polyimide layer edge 126a, in accordance with embodiments, electrical test modules may be placed for testing of the IC provided in the IC area 102.

The crack stop structures 108a and 108b are formed in the interconnect layer 120. Each of the crack stop structures 108a, 108b is formed by a stacked metal layer structure 128a, 128b, each structure including two columns of four stacked metal layers interconnected by respective vias (not shown). The metal layers including the metal layer 112 and additional metal layers 130a to 130c. The lowermost layer 112 is fixed to the surface 116 of the substrate 114 by respective contacts 132. Also the extended portion 112a is fixed or nailed by the contacts 132 to the substrate 114 for preventing lifting of these layers from the substrate surface 116.

By means of the above described design of the kerf area 104 including the extended portions 112a and the trenches 110a, 110b, the structural integrity in this part of the device layer 102 is weakened so that laterally propagating cracks that may be generated during dicing will be deflected essentially perpendicular to the surface 116 of the substrate and chipping will stop before the polyimide layer edge 126a.

Further, the wafer 100 comprises sealring structures 134 arranged below the metal layers 124 adjacent to the respective crack stop structures 108a, 108b. The sealrings 134 may be conventional and are formed of a plurality of stacked metal rings that surround the central area of the IC area 102. The sealring structures 134 include four metal layers 136a to 136d, and the lowermost layers 136a are fixed to the substrate 114 by respective contacts 138. Further, in the kerf area 104 a PCM pad 140 (PCM; Process Control Monitor) may be arranged.

In the embodiment of FIG. 1, the dimension of the kerf area 104 may be between 20 μm and 200 μm micrometers, or, more specifically, between 80 μm and 100 μm, such as, for example, 90 μm. The distance between the two trenches 110a, 110b may be between 10 μm and 170 μm, and more specifically between 45 μm and 75 μm, or even more preferably between 55 μm and 65 μm. The distance from the metal layer edge 124a facing the dicing area to the trench wall facing the dicing area 106 may be between 5 μm and 40 μm and, more preferably, between 21 μm and 17 μm. The distance between the metal layer edge 124a and the polyimide layer edge 126a may be between 4 μm and 38 μm and, more preferably, between 8 μm and 12 μm. The area in which the sealring 134 is arranged may be between 15 μm and 20 μm.

Figure 2:
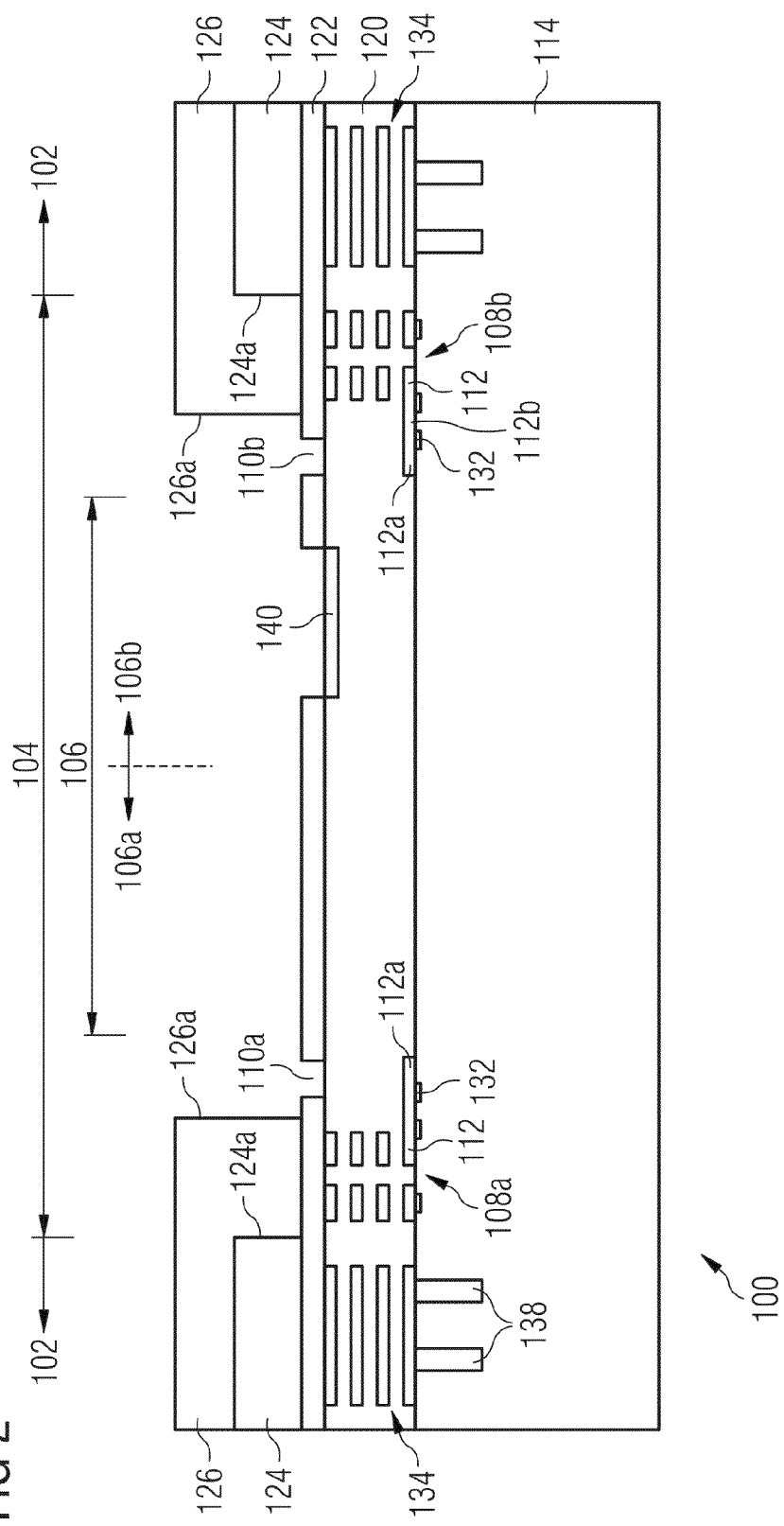
FIG. 2 shows a further embodiment of a wafer including the inventive chipping stop structure.

FIG. 2 shows a further embodiment of a wafer including the inventive chipping stop structure. The structure of the wafer 100 is similar to that in to FIG. 1, especially with regard to the crack stop structure 108 and the trench 110. When compared to FIG. 1, the kerf area 104 is broader and includes a dicing area 106 separated into a sawing area 106a and a PCM area 106b. The dimensions may be similar to the ones of FIG. 1, except for the broader kerf area 104.

FIG. 3 shows another embodiment of a wafer 100 in accordance with embodiments of the invention. The wafer depicted in FIG. 3 is similar to the one of FIG. 2 except that the trenches 110a, 110b extend through the passivation layer 122 into the upper surface of the interconnect layer 120. In addition, beneath the PCM pad 140 a stacked metal layer structure 142 is provided. In the sawing area 106a a sawing street 144 is schematically depicted, thereby indicating in the figure where the separation, e.g., by means of a sawing blade, takes place.

With regard to FIGS. 4 and 6, the effects of the inventive chipping stop structure will be described in further detail. The weakening of the structural integrity of the interconnect layer and the redirecting of a laterally propagating crack to be deflected essentially perpendicular to the surface of the substrate will be described so that chipping stops before the polyimide layer edge is reached.

FIG. 4(a) shows a left hand portion of the wafer 100 of FIG. 3. Also, the sawing street 144 is depicted. The lower metal layer 112 of the crack stop structure 108a may be mounted to the surface 116 of the substrate 114 by means of the contacts 132 so that the layer 112, other than in the embodiment shown in FIG. 3, is arranged at a distance from the upper surface 116 of the substrate 114. In FIG. 4(a) separating the wafer along the sawing street 144 is shown that may result in a crack that is schematically represented by the dashed line 146. Due to the inventive structure comprising the trench 110a and the extended metal layer 112, the structural integrity in this part of the wafer is weakened so that the crack 146, at the beginning, propagates laterally, as is depicted by arrow 148, however, due then the crack starts to propagate in a direction substantially perpendicular to the surface 116 of the substrate as is shown by arrow 150 and will finally terminate at the trench 110a. The crack 146 will result in a chipping in the area 152 of the interconnect layer 120, which will be chipped away during separating the wafer.

FIG. 4(b) shows a top view of the structure shown in FIG. 4(a), and it can be seen that a crack extending from the saw street 144 results in a chipping/peeling area 154 which, due to the inventive structure raises from the right hand edge of the structure shown in FIG. 4(a) upwards to the trench 110a and terminates at the trench 110 so that the chipping area 154 stops before the polyimide layer edge 126a is reached.

FIG. 5(a) shows the same portion of the wafer 100 of FIG. 3 as in FIG. 4(a). FIG. 5(b) is a photographic representation of the actual structure of a wafer incorporating the inventive chipping stop structure. FIG. 5(c) shows a further photographic representation of the structure of FIG. 5(a) taken along a line of FIG. 5(b) which is basically in the center of the chipping area 154. From FIG. 5(b) and FIG. 5(c) it can be seen that the chipping 154, in view of the inventive structure, stops at the trench 110a and does not reach the polyimide layer edge 126a.

FIG. 6 shows yet another embodiment of the invention. FIG. 6 shows a wafer 100 similar to the one of FIG. 3 except that the dicing area now includes, in addition to the sawing area 106a and the PCM/RCM area 106b, an additional RCM/PCM area 106c. Both areas 106b and 106c include PCM pads 140a and 140b and additional metal layer structures 142a and 142b beneath the PCM pads are formed in the interconnect layer 120. Other than in the embodiment of FIG. 3, the layer 112 of the respective crack stop structures 108a and 108b extends beyond the crack stop structure towards the dicing area 106a such that its edge facing the dicing area 106a does not reach the area below the trench 110a and 110b.

In accordance with the embodiment shown in FIG. 6, an additional crack stop structure or pattern 160a and 160b is formed in the interconnect layer 120 below the respective trenches 110a and 110b. Each of the additional crack stop structure 160 is formed by a stacked layer structure including the metal layers 162a to 162c. The lowermost layer 162a is fixed to the surface of the substrate 114 by contacts. Further, the metal layers 160a to 160c of the additional crack stop structure 160, like the metal layers of the other stacked metal layer structures, are electrically connected, e.g., by vias. It is noted that also the stacked metal layer structures depicted in the preceding figure may be electrically connected with each other, e.g., also be vias. In FIG. 6, the trench 110a, 110b extends through the passivation layer 122 into the interconnect layer 120. Further, the metal layer 124 contacts an uppermost layer of the respective sealring structure.

The provision of the additional crack stop pattern 160 under the passivation trench 110 allows to even more reliably stop cracks with higher energy, i.e., cracks which are more likely to go straight past the trench 110, without consuming more area, since the width of the crack stop structure is designed to be essentially the same as the width of the passivation trench.

FIG. 7 shows another embodiment of a wafer including the inventive structure for stopping cracks and avoiding chipping. The wafer shown in FIG. 7 has basically the same structure as the one of FIG. 6, except that other types of PCM/RCM areas are shown to be arranged in the kerf area 104. Here, the PCM structures are exemplarily hidden below the passivation layer 122 and are formed by lithographically formed metal stacks 170a, 170b. They form, for example, optical PCM structures. The sawing street 144 in the dicing area 106 is defined in the area between the lithographically formed metal stacks 170a, 170b or the are crossing the same.

FIG. 8 is a top view of a wafer 100 depicting a plurality of IC areas 102 separated from each other by respective kerf areas 104, including the respective trenches 110 surrounding the IC areas 102. Further, the sealrings 134 and the dicing areas 106 are indicated.

FIG. 9 shows an integrated circuit chip 200 that is obtained by separating a wafer as it is depicted in FIG. 8 in the dicing area 106. The integrated circuit IC is schematically depicted to be arranged inside the sealring 134. The IC chip 200 includes the features which have been described in detail above, and the dicing process results, at the corners of a periphery of the IC chip 200, in chipped away areas 152. However, due to the provision of the inventive structure for stopping chipping areas, it is avoided that the chipping area reaches the edge 126a of the polyimide layer 126.

In the above, embodiments have been described, in accordance with which the layer 112 extends under a trench in such a way that the edge of the layer facing the dicing area and the trench wall facing the dicing area vertically coincide. However, the invention is not limited to such embodiments, rather, the layer 112 may extend in such a way so as to only partially overlap with the trench or to slightly extend over the trench towards the dicing area.

Further, in the embodiment describing the provision of the additional crack stop structure, the metal layer of the additional crack stop structure and the metal layer of the crack stop structure have been described as separate metal layers, however, in accordance with embodiments the crack stop structure and the additional crack stop structure may comprise a common lower metal layer so that the metal layer 112 of the crack stop structure extends in such a way that it also forms part of the additional crack stop structure.

In accordance with embodiments of the invention, a method for manufacturing an integrated circuit chip, as it is depicted in FIG. 9, is taught. In accordance with the manufacturing method, a wafer as described in one of the above described embodiments is provided and diced in a dicing area to separate the respective IC areas into separate IC chips, for example, as depicted in FIG. 9, and the dicing may be done by sawing the wafer along a sawing street.

FIG. 10 shows an enlarged view of a corner portion of the wafer shown, for example, in FIG. 8.

FIGS. 11 to 13 show an even more enlarged view of the corner portion of FIG. 10. In particular, merely a sub-portion of FIG. 10 is shown in FIG. 11. This sub-portion concentrates on showing an exemplary implementation of the additional crack stop structure 160. In the embodiment of FIGS. 11 to 13, the additional crack stop structure 160 is, along a width direction, i.e., a direction transverse to the longitudinal direction of the additional crack stop structure 160 and curve lines and so forth, divided-up into three substructures: when starting from the lateral edge of additional crack stop structure 160, facing the dicing area, a first substructure 180, a second substructure 182 and a third substructure 184. The first substructure 180 is nearest to the dicing area 106 (not shown in FIGS. 10 to 13) and comprises one or more discontinuous (dashed) metal line stacks 186a and 186b, wherein in FIG. 13 exemplarily two such metal line stacks 186a and 186b are shown as extending in parallel to each other along the dicing area. Each metal line stack 186a,b comprises one discontinuous (dashed) metal line per metal layer, i.e., metal line stack 186a comprises a discontinuous metal line 188a in metal layer 162a and, there above, a discontinuous metal line 188b in metal layer 162b, and likewise metal line stack 186b comprises a discontinuous metal line 190a in metal layer 162a and a discontinuous metal line 190b in metal layer 162b. Each metal line 188a, b and 190a, b is composed of metal stripes 192, spaced apart from each other by respective gaps 194. Within each metal layer 162a and 162b, parallel metal lines 188 and 190 have their stripes 192 and gaps 194 located displaced relative to each other, i.e., the gap of one metal line is, in longitudinal direction, located next to a metal stripe of the neighboring metal line and vice versa. The same applies in layer stack direction, i.e., in the layer normal direction: within a metal line stack 186a and 186b, one metal line such as 188a has its gaps 194 positioned, in longitudinal direction, next to a metal stripe 192 of the metal line of the same metal line stack in the neighboring metal layer and vice versa. In other words, neighboring, in terms of metal layers or laterally, discontinuous metal lines have their stripes 192 arranged out of phase relative to each other.

Within the first substructure 180, the metal lines within the various metal layers are not connected to each other via vias. They are isolated from each other. Differing therefrom, the second substructure 182 is composed of one or more metal line stacks 196 (merely one is shown in FIGS. 11 to 13, as an example), the discontinuous metal lines 198a and 198b of which are, within one metal line stack 198b, connected to each other via vias 200. To be more precise, within one metal line stack 196, the stripes 192 of one discontinuous metal line 198b are located out of phase or displaced in the longitudinal direction relative to the metal stripes of the discontinuous metal line 198a located within the neighboring metal layer 162a, so that however the metal stripes 192 of these metal lines 198a, b overlay each other in layer stack direction, so as to be connected with each other via vias at each rear and leading end position of each metal stripe 192.

Thus, while the metal stripes 192 within the first substructure 180 are disconnected in both dimensions, i.e., laterally as well as vertically, and the metal stripes of the second substructure 182 are merely connected to each other vertically, i.e., within a metal line stack 196, within the third substructure 184 interconnections between laterally neighboring metal line stacks 202a, 202b, 202c and 202d exist in both dimensions, i.e., laterally as well as vertically. FIGS. 11 to 13 exemplarily show the third substructure 184 to be composed of four metal line stacks 202a to 202d extending in parallel to each other along the dicing area at a side of the additional crack stop structure 160, facing away from the dicing area. However, any other number could be used as well. Again, each metal line stack 202a to 202d comprises a discontinuous metal line per metal layer 162a and 162b. In case of the third substructure 184, however, the stripes 192 of one discontinuous metal line such as 204a, is connected through a gap 194 of a neighboring discontinuous metal line 204b located within the same metal layer 162a but belonging to a laterally neighboring metal line stack 202b, to the metal stripes 192 of the next but one discontinuous metal line 204c of the next but one metal line stack 202c. To this end, within each metal layer 162a and 162b, transversally extending metal ridges 206 interconnect, within the respective metal layer, metal stripes 192 of discontinuous metal lines of metal line stacks via gaps 194 of metal lines of the same metal layer, belonging to a metal line stack located therebetween. Again, from one metal layer to the next, the positions of metal ridges 206 and corresponding gaps are displaced relative to each other along the longitudinal direction. Vias 200 interconnect the metal stripes 192 and metal ridges 206 of the third substructure 186 across the metal layers. As shown in FIGS. 11 to 13, the vias may be positioned such that each simply connected region composed of two metal stripes 192 of different metal line stacks, but located within the same metal layer, and the metal ridge 206 interconnecting the same (visible in FIGS. 11 and 12 as I-shaped areas) is connected to three simply connected metal regions of the third substructure of a neighboring metal layer.

It should be noted that although FIGS. 11 to 13 concentrated on two metal layers 162a and 162b only, the additional crack stop structure 160 may be formed within a higher number of metal layers as already depicted, for example, in FIG. 6. Moreover, FIGS. 11 to 13 merely exemplarily showed the lower most metal layers to be involved in forming the additional crack stop structure 160, but naturally another subset of the metal layers may also be used.

The additional crack stop structure 160 as presented in the embodiment of FIGS. 11 to 13 is very effective in preventing cracks which, by accident, do not bend off to reach trench 110, from reaching crack stop structure 108, for example. In particular, the area 208 which extends immediately adjacent to additional crack stop structure 160 on the side facing the IC area 102, may, for example, serve as an area allowing, for example, an optical check whether any crack managed to pass the additional crack stop structure and the result of this check may be used to decide whether the respective chip has to be discarded or not.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

What is claimed is:

1. A wafer, comprising:
   a plurality of IC areas; and
   a kerf area arranged between the plurality of IC areas;
   wherein the kerf area comprises a dicing area, a crack stop structure arranged between an IC area and the dicing area, and a trench arranged between the crack stop structure and the dicing area; and
   wherein the crack stop structure includes an extended metal layer extending beyond the crack stop structure towards the dicing area.

2. The wafer of claim 1, wherein the extended metal layer extends into an area between the crack stop structure and the trench.

3. The wafer of claim 2, further comprising a further crack stop structure arranged under the trench.

4. The wafer of claim 3, wherein the crack stop structure includes at least one metal layer, and wherein the metal layers of the crack stop structure and the further crack stop structure are continuous or discontinuous.

5. The wafer of claim 4, wherein the further crack stop structure is, in a direction pointing from the dicing area to the IC area, divided up into first, second and third substructures, among which the first substructure in line is composed of discontinuous metal lines composed of metal stripes which are isolated between the metal layers and within the metal layers, the second substructure in line is composed of metal stripes which are, via vias, connected to each other across metal layers, and the third substructure in line is composed of metal stripes interconnected both, via vias, across metal layers and, via laterally extending metal ridges, within metal layers.

6. The wafer of claim 1, wherein the extended metal layer extends under the trench.

7. The wafer of claim 6, wherein the extended metal layer of the crack stop structure and the trench are arranged such that a trench wall portion facing the dicing area vertically coincides with an edge of the extended metal layer facing the dicing area.

8. The wafer of claim 7, comprising a further crack stop structure including a part of the extended metal layer and being arranged under the trench.

9. The wafer of claim 1, wherein the extended metal layer is fixed to prevent lifting thereof.

10. The wafer of claim 1, comprising:
a substrate; and
an interconnect layer;
wherein the crack stop structure is arranged in the interconnect layer with the extended metal layer being fixed to the substrate by a contact to prevent the extended metal layer from being lifted from the substrate; and
wherein the trench is formed in the interconnect layer.

11. The wafer of claim 10, wherein the trench does not extend to the substrate.

12. The wafer of claim 10, wherein the interconnect layer comprises a passivation layer, and wherein the trench is formed only in the passivation layer or extends through the passivation layer towards the substrate.

13. The wafer of claim 1, wherein the crack stop structure comprises a plurality of stacked metal layers connected by respective vias.

14. The wafer of claim 1, comprising a sealring arranged around an IC area.

15. A wafer, comprising:
a plurality of IC areas; and
a kerf area arranged between the plurality of IC areas;
wherein the kerf area comprises a dicing area, a crack stop structure arranged between an IC area and the dicing area, and a trench arranged between the crack stop structure and the dicing area; and
wherein the crack stop structure is structured to weaken a structural integrity of an area between the crack stop structure and the dicing area so that laterally propagating cracks will be deflected substantially perpendicular to a surface of the wafer.

16. A wafer, comprising:
a substrate;
an interconnect layer formed on the substrate;
a passivation layer formed on the interconnect layer;
a plurality of IC areas; and
a kerf area arranged between the plurality of IC areas;
wherein the kerf area comprises a dicing area, a crack stop structure arranged in the interconnect layer and between an IC area and the dicing area, and a trench extending through the passivation layer and arranged between the crack stop structure and the IC area;
wherein the crack stop structure comprises a plurality of stacked metal layers connected with each other by respective vias; and
wherein a lowermost of the stacked metal layers is fixed by contacts to the substrate and extends beyond the crack stop structure towards the dicing area.

17. An integrated circuit chip, comprising:
an IC area;
a crack stop structure arranged between the IC area and a periphery of the integrated circuit chip; and
a trench arranged between the crack stop structure and the integrated circuit chip periphery;
wherein the crack stop structure includes an extended metal layer extending beyond the crack stop structure towards the integrated circuit chip periphery.

18. A method for manufacturing an integrated circuit chip, the method comprising:
providing a wafer, the wafer comprising a plurality of IC areas and a kerf area arranged between the plurality of IC areas, wherein the kerf area comprises a dicing area, a crack stop structure arranged between an IC area and the dicing area, and a trench arranged between the crack stop structure and the dicing area, and wherein the crack stop structure includes an extended metal layer extending beyond the crack stop structure towards the dicing area; and
dicing the wafer in the dicing area.

19. The method of claim 18, wherein dicing the wafer comprises sawing the wafer along a sawing street in the dicing area.

20. A wafer, comprising:
a plurality of IC areas; and
a kerf area arranged between the plurality of IC areas, the kerf area comprising a dicing area, a crack stop structure arranged between an IC area and the dicing area, and a trench arranged between the crack stop structure and the dicing area; and
a further crack stop structure arranged under the trench.

21. The wafer of claim 20, wherein the crack stop structure includes at least one metal layer, and wherein the metal layers of the crack stop structure and the further crack stop structure are continuous or discontinuous.

22. The wafer of claim 20, wherein the further crack stop structure is, in a direction pointing from the dicing area to the IC area, divided up into first, second and third substructures, among which the first substructure in line is composed of discontinuous metal lines composed of metal stripes which are isolated between the metal layers and within the metal layers, the second substructure in line is composed of metal stripes which are, via vias, connected to each other across metal layers, and the third substructure in line is composed of metal stripes interconnected both, via vias, across metal layers and, via laterally extending metal ridges, within metal layers.

* * * * *